(12) United States Patent
Akimoto et al.

(10) Patent No.: US 7,733,309 B2
(45) Date of Patent: Jun. 8, 2010

(54) IMAGE DISPLAY APPARATUS

(75) Inventors: Hajime Akimoto, Ome (JP); Toshihiro Sato, Mobara (JP); Yoshirou Mikami, Hitachiota (JP); Hiroshi Kageyama, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 1375 days.

(21) Appl. No.: 10/438,841

(22) Filed: May 16, 2003

(65) Prior Publication Data
US 2004/0004591 A1    Jan. 8, 2004

(30) Foreign Application Priority Data
May 17, 2002    (JP) ............................. 2002-142369

(51) Int. Cl.
| | |
|---|---|
| G09G 3/10 | (2006.01) |
| G09G 3/30 | (2006.01) |
| G09G 3/34 | (2006.01) |
| G09G 5/00 | (2006.01) |
| G06F 3/038 | (2006.01) |
| H01J 1/15 | (2006.01) |
| H01J 19/08 | (2006.01) |
| H01J 1/62 | (2006.01) |
| H01J 63/04 | (2006.01) |
| H01K 1/02 | (2006.01) |

(52) U.S. Cl. ................ 345/84; 313/343; 313/500; 315/169.3; 345/206; 345/211; 345/76

(58) Field of Classification Search ... 315/169.1–169.4; 345/55, 76, 80, 82–84, 103, 204–206, 211–213; 313/343, 396, 498, 500, 506
See application file for complete search history.

(56) References Cited

U.S. PATENT DOCUMENTS

| | | | | |
|---|---|---|---|---|
| 4,468,659 | A  * | 8/1984 | Ohba et al. ................. | 345/206 |
| 6,528,950 | B2 * | 3/2003 | Kimura ................... | 315/169.3 |
| 6,541,910 | B2 * | 4/2003 | Uchida et al. ............... | 313/504 |
| 6,714,178 | B2 * | 3/2004 | Koyama et al. .............. | 345/76 |
| 6,747,617 | B1 * | 6/2004 | Kawashima ................. | 345/76 |
| 6,771,258 | B2 * | 8/2004 | Aoki ........................ | 345/204 |
| 7,164,155 | B2 * | 1/2007 | Yamazaki et al. ............ | 257/84 |
| 7,557,779 | B2 * | 7/2009 | Tanada ...................... | 345/76 |
| 2001/0048408 | A1* | 12/2001 | Koyama et al. .............. | 345/76 |

* cited by examiner

*Primary Examiner*—Alexander S Beck
(74) *Attorney, Agent, or Firm*—Antonelli, Terry, Stout & Kraus, LLP.

(57) ABSTRACT

In a light emitting display apparatus requiring power supply lines, excellent uniformity in display luminance is provided over a relatively large screen by disposing at least one of input terminals for the power supply lines between input terminals for signal lines.

16 Claims, 10 Drawing Sheets

IMAGE DISPLAY APPARATUS

BACKGROUND OF THE INVENTION

The present invention relates to an image display apparatus featuring excellent uniformity in display luminance, even in the case of a relatively large screen size.

Hereinafter, conventional techniques will be described by referring to FIGS. 11 and 12.

FIG. 11 is a configuration diagram of a liquid crystal display device as a first prior art employing a conventional technique. Arranged in a display section in a matrix configuration are a plurality of pixels 205 each of which has a liquid crystal capacitance 204 optical properties of which are controlled by an applied electric field. The pixels 205 are mutually connected via gate lines 206 and signal lines 207. One end of each of the gate lines 206 is terminated as a gate line terminal 208, and one end of each of the signal lines 207 is terminated as a signal line terminal 209. In each of the pixels 205, the signal line 207 is connected to one terminal of the liquid crystal capacitance 204 via an input TFT (Thin-Film-Transistor) 201, and a gate of the input TFT 201 is connected to the gate line 206. Although omitted in FIG. 11, all the other terminals of the liquid crystal capacitance 204 of all the pixels are connected together to form a common electrode and are connected to the same power supply. The above structure is provided on a glass substrate 200.

In the following, operation of the first prior art will be described. The gate line terminals 208 are connected to an external gate line driver IC (Integrated Circuit), and the gate line driver IC scans the gate lines 206 successively. Here, the signal line terminals 209 are connected to an external signal line driver IC, and the signal line driver IC applies signal voltages to the signal lines 207 in specified timing. The gate line driver IC opens or closes the input TFTs 201 in an intended pixel row via the gate lines 206 such that the signal voltages supplied to the signal lines 207 from the signal line driver IC are input into and retained in the liquid crystal capacitances 204. With this configuration, each of the liquid crystal capacitances 204 can produce an optical display in accordance with a corresponding of the signal voltages. Such prior art has been used most typically as a configuration of an active matrix liquid crystal display device using amorphous Si.

Next, a second prior art will be described by referring to FIG. 12.

FIG. 12 is a configuration diagram of a light emitting display device as the second prior art. Pixels 215 each provided with an organic light emitting diode (OLED) element 214 as a light emitting element are arranged in a display section in a matrix configuration Here, the OLED is sometimes referred to as an organic EL (electroluminescent) element, but it shall be referred to simply as an OLED element hereunder for simplification.

The pixels 215 are mutually connected via gate lines 216, signal lines 217, power supply lines 220, etc. Both ends of the gate lines 216 are connected to gate line scanning circuits 218 on the right and left sides of the gate lines 216, respectively. One end of each of the signal lines 217 is connected to a signal input circuit 219. One end of each of the power supply lines 220 is terminated as a power supply input terminal 225 via a power supply bus 221. An input line group 222 to the gate line scanning circuit 218 and an input line group 223 to the signal input circuit 219 are respectively bundled together to be connected to a gate-line-scanning-circuit input terminal group 224 and a signal-input-circuit input terminal group 226, respectively.

In each of the pixels 215, the signal line 217 is connected to one terminal of a pixel capacitance 212 and a gate of a drive TFT 213 via an input TFT 211, while the other terminal of the pixel capacitance 212 and a source terminal of the drive TFT 213 are connected to the power supply line 220. A drain terminal of the drive TFT 213 is connected to a common power supply terminal (omitted in FIG. 12) via the OLED element 214. Here, the input TFT 211 and the drive TFT 213 are formed of polycrystalline Si TFTs. The aforementioned structure is disposed on a glass substrate 230.

In the following, operation of the second prior art will be described. When display data fed by the signal-input-circuit input terminal group 226 are written into the signal line 217 via the signal input circuit 219, the gate line scanning circuit 218 successively selects the gate lines 216 based upon drive signals fed from the gate-line-scanning-circuit input terminal group 224 in synchronization with the above-stated writing. Thereby, the signal voltage fed to the signal line 217 is input into the pixel capacitance 212 and the gate of the drive TFT 213 of a corresponding one of the pixels 215 in a selected one of the gate lines 216 via the input TFT 211 of the corresponding one of the pixels 215, and the signal voltage is retained in the pixel capacitance 212. In the pixel 215, the drive TFT 213 is driven according to the signal voltage thus written, and thereby the OLED element 214 emits light of a specified luminance.

Such prior art is described in detail in Japanese Patent Application Laid-Open No. 2002-14653, etc., for example.

SUMMARY OF THE INVENTION

It has been found that it is difficult to provide an image display apparatus superior in uniformity of display luminance over a relatively large screen area by applying the above-explained conventional techniques to a light emitting display device requiring power supply lines. The following will explain its reason.

In the liquid crystal display device of the above-explained first prior art, the signal lines are provided with output terminals separate from each other, respectively. This configuration is inevitable because signal voltages to be supplied to the signal lines differ from pixel to pixel.

On the other hand, in the light emitting display device of the above-explained second prior art, plural power supply lines 220 are connected together via the power supply bus 221, and are connected to the power supply input terminals 225 in common. It is a natural conception that the input terminals 225 are divided into one or two groups in this way so as to reduce areas occupied by power supply input terminals 225 because the power supply lines 220 in all the columns are supplied with the same supply voltage.

However, it has been found that it is difficult to secure uniformity in display luminance in the case of designing a light emitting display device of a medium or larger size by using the above conventional conception. In the following, this problem will be explained in detail.

Now, assume that each pixel consumes an electric current of 1 μA for generating a high-luminance-level light. Consider a case of designing a light emitting display device having 1,000 (in a vertical direction)×2,000 (in a horizontal direction)×3 colors (red, green and blue) pixels of 100 μm×300 μm in size. Then each of the power supply lines is supplied with a current of 1 μA×1,000 (1 mA). Suppose the current is supplied from the left and right sides of the panel via the power supply bus 221 as in the case explained in connection with FIG. 12, and that a resistance of the power supply bus 221 per pixel column (100 μm) is R (Ω).

Since the number of the power supply lines between both ends of a pixel and a centeral part of the power supply bus 221 is 3,000, the voltage drop ΔV (V) at the central part of the power supply bus 221 is expressed by the following formula:

$$\Delta V = \tfrac{1}{2} \times 3000 \times (3000-1) \times 1 \; mA \times R(\Omega) \qquad \text{Equation (1)}$$

Here, as an example, assume that ΔV<100 mV. Then solving the above equation for the resistance R gives R<22.2µΩ.

Suppose the power supply bus 221 is made of an aluminum line of 0.1Ω in sheet resistance. Then the width of the power supply bus required for realizing the value of 22.2µΩ per 100 µm turrs out to be 45 cm. The power supply bus of 45 cm in width is not realistic for the display section of 30 cm×60 cm in size. It is apparent from this fact that non-uniformity in light-emission luminance due to the voltage drop caused by the power supply bus 221 poses a serious problem in a light emitting display device of a medium or larger size employing only an extension of the conventional techniques.

It is thought that production of the active matrix type OLED displays will start with small panels of about 51 mm (2 inches) in size, and it is expected that demand for medium- and large-sized panels will increase before long. Even in that case, it is very difficult to place the medium- and large-sized active matrix OLED displays on the market without solving the above-explained problem.

The above problems is solved by an image display apparatus comprising: a display section composed of a plurality of pixels; a plurality of signal lines for supplying display signals into the plurality of pixels; a portion of pixel selecting means for selecting ones from among the plurality of pixels to be supplied with the display signals; and a plurality of power supply lines for supplying display electric powers to the selected ones of the plurality of pixels, wherein the display section, the plurality of signal lines, the portion of pixel selecting means, and the plurality of power supply lines are disposed on a same surface of a substrate, a plurality of signal input terminals for inputting the display signals to the plurality of signal lines, and a plurality of power supply input terminals for supplying the display electric powers to the plurality of power supply lines are disposed on the same substrate, and the plurality of power supply input terminals are arranged such that at least one of the plurality of power supply input terminals is disposed between adjacent ones of the plurality of signal input terminals.

DETAILED DESCRIPTION OF THE PREFERRED EMBODIMENTS

First Embodiment

A first embodiment according to the present invention will be described by referring to FIGS. 1 to 4.

To begin with, the overall configuration of the present embodiment will be described by referring to FIGS. 1 and 2.

Figure 1:
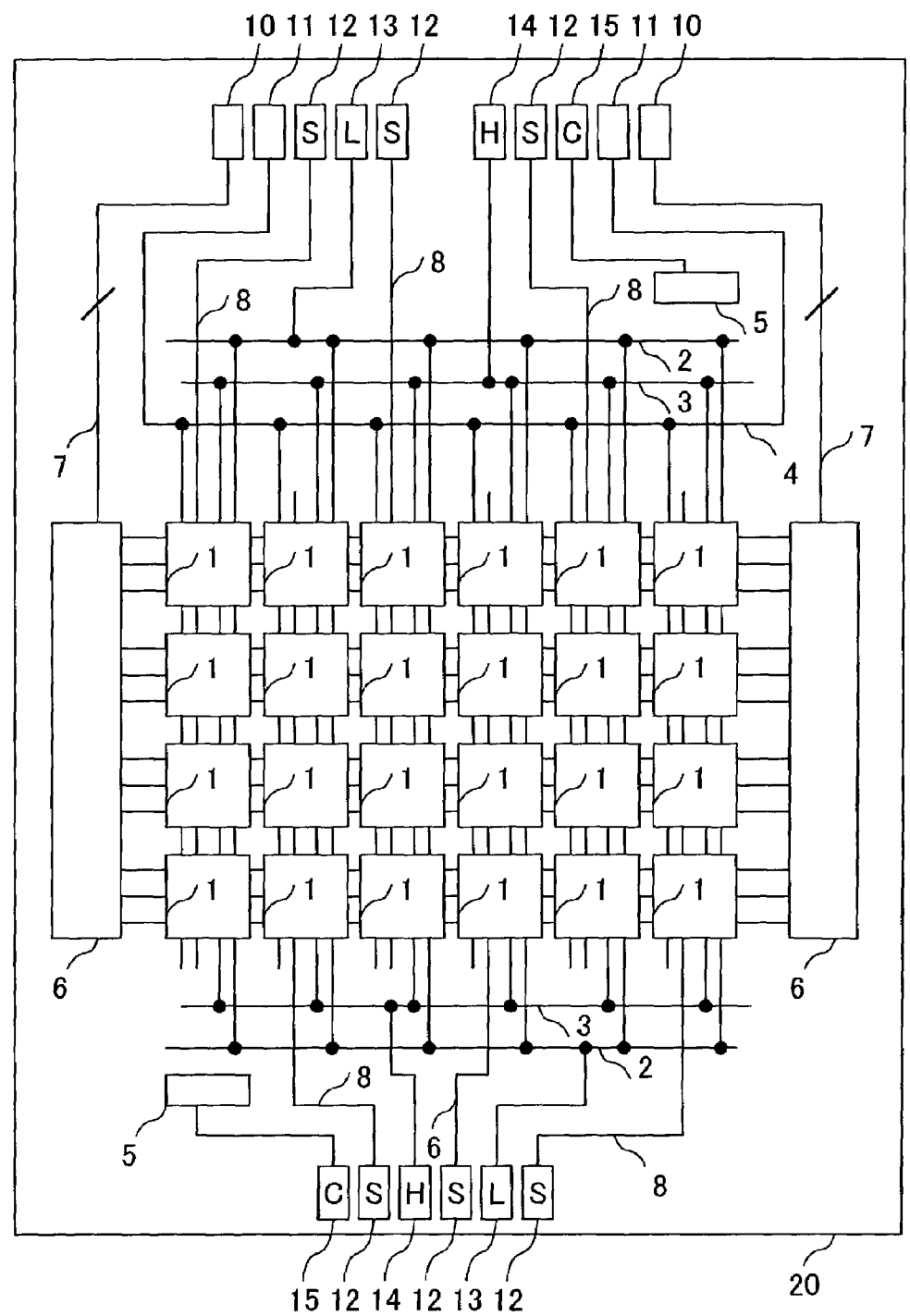
FIG. 1 is a configuration diagram of an OLED display panel of a first embodiment in accordance with the present invention.
Figure 2:
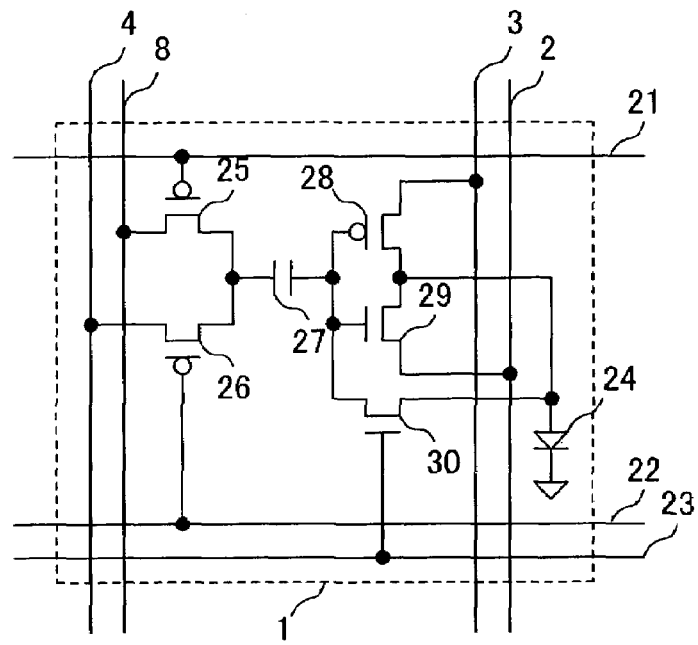
FIG. 2 is an enlarged view of a pixel provided in the first embodiment.

FIG. 1 is a configuration diagram of an OLED (Organic Light Emitting Diode) display panel of a first embodiment, and FIG. 2 is an enlarged view of a pixel 1. The pixels 1, each of which has an OLED element 24 used as a pixel light emitting element, are arranged in a display section in a matrix configuration. Each of the pixel 1 is connected to peripheries via a signal gate line 21, a triangular waveform gate line 22, a reset line 23, a signal line 8, a triangular waveform line 4, a power supply line 3, a load line 2, etc, as shown in FIG. 2. In each of the pixels 1, the signal line 8 and the triangular waveform line 4 are connected via an input TFT 25 and a triangular waveform TFT 26, respectively, to one terminal of a storage capacitor 27. The other terminal of the storage capacitor 27 is connected to one terminal of a reset TFT 30 and an input terminal of an inverter circuit formed of a pMOS-TFT 28 and an nMOS-TFT 29. The other terminal of the reset TFT 30 and an output terminal of the inverter circuit are grounded in common to a common grounding terminal (not shown in FIG. 2) via the OLED element 24. In the peripheral area of a pixel section, as shown in FIG. 1, the signal gate line 21, the triangle waveform gate line 22, and the reset line 23 are connected to gate drive circuits 6, the signal lines 8 are independently connected to corresponding ones of signal line terminals 12 which are arranged at the periphery of the glass substrate 20, the triangular waveform lines 4 are joined together above the pixel section and are connected to the triangular waveform terminals 11 provided on the right and left sides, the power supply lines 3 are joined together above and below the pixel section and are connected to power supply terminals 14, and likewise, load lines 2 are joined together above and below the pixel section and are connected to load line terminals 13. The pixels 1 and the gate drive circuits 6 are composed of polycrystalline Si TFTs on the glass substrate 20.

Here, FIG. 1 illustrates 6×4 pixels only to simplify the figure, but actually, pixels of 800 (in a vertical direction)×600 (in a horizontal direction)×three colors (red, green and blue) are arranged in the first embodiment, and therefore a larger number of signal line terminals 12 and triangular waveform line terminals 11 are arranged. More specifically, the signal line terminals 12 are provided in number of 1200, above and below the pixel section, respectively, and the load line terminal 13, the power supply line terminal 14 and the common grounding terminal 15 are arranged alternately in a line between the signal line terminals 12. The common grounding terminals 15 and a common grounding terminal (not shown in FIG. 1) in each pixel are connected to each other at a grounding contact point 5. A gate drive line group 7 is connected to the gate drive circuit 6, and is terminated as a gate drive line terminal group 10, but is indicated by simplified representation in FIG. 1.

The polycrystalline Si TFT structure, the OLED structure, the gate drive circuit 6, etc. in the above-explained configuration employ no special structures in particular, and they are generally used ones as described in many literatures including, for example, aforementioned Japanese Patent Application Laid-Open No. 2002-14653 which has been quoted as the prior art. Therefore, the detailed explanation thereof shall be omitted here.

Next, operation of the pixel 1 in the first embodiment will be described by referring to FIG. 2.

The pixel 1 in the first embodiment cancels out variations in characteristics of the pMOS-TFT 28 and the nMOS-TFT 29 which form an inverter circuit, by concurrently executing writing of a signal voltage and resetting of the inverter circuit. In executing writing of a signal into the pixel 1 under consideration, the input TFT 25 and the reset TFT 30 are turned on simultaneously. At this time, the input voltage to the inverter circuit comprising the pMOS-TFT 28 and the nMOS-TFT 29 is reset to a threshold voltage of the inverter circuit because the input terminal and the output terminal of the inverter circuit are short-circuited. On the other hand, a signal voltage is written from the signal line 8, and a difference in voltage between the threshold voltage and the signal voltage is stored in the storage capacitor 27. Upon completing of writing, the reset TFT 30 and the input TFT 25 are turned off successively in this order, and in turn, the triangular waveform TFT 26 is brought into an all-time-ON mode, thereby a triangular waveform voltage is applied at all times from the triangular waveform line to one terminal of the storage capacitor 27. Here, the triangular waveform voltage is a sweep voltage containing a signal voltage, and when the triangular waveform voltage is smaller than a previously written signal voltage, the inverter circuit will be turned on by the storage capacitor 27. That is to say, a value of the signal voltage can be converted into a duration of on-time of the inverter circuit. Here, since the output of the inverter circuit is connected to the OLED element 24, it is possible to perform gray-scale display driving which drives the OLED element 24 only during a time corresponding to the signal voltage by adequately adjusting the drive voltage of the inverter circuit.

Figure 3:
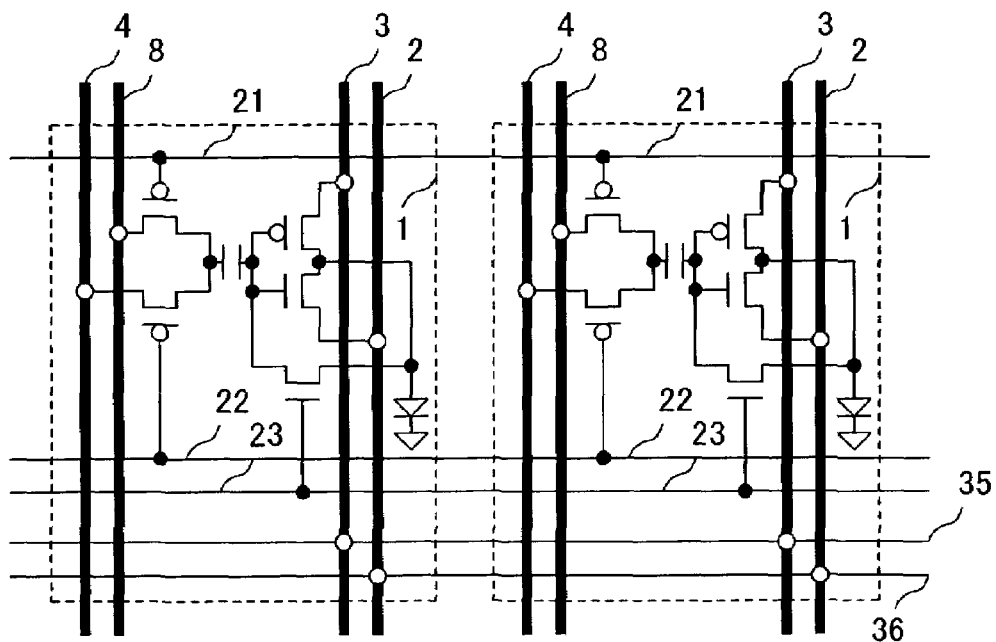
FIG. 3 is a horizontal connection diagram provided in the first embodiment.

Next, the power supply line in the pixel section will be described in further details by referring to FIG. 3. FIG. 3 illustrates a connection in a horizontal direction between two pixels 1, and in FIG. 3, thick lines show low-resistance lines formed of Al, thin lines indicate lines using a gate-level layer, and open circles between the lines show contact points.

As is apparent from FIG. 3, the signal gate line 21, the triangular waveform gate line 22 and the reset line 23 are each formed of a gate-level layer, while the signal lines 8, the triangular waveform lines 4, the power supply lines 3 and the load lines 2 are formed of low-resistance lines formed of Al. Here, since the largest current flows through the power supply lines 3 in particular for causing the OLED elements 24 to emit light, low-resistance lines are used for vertically extending lines. In addition, the two power supply lines 3 are mutually connected in the horizontal direction with a line using the gate-level layer. Likewise, the two load lines 2 are mutually connected in the horizontal direction with a line using the gate-level layer. This arrangement contributes to the prevention of degradation in picture quality which is represented by a blurring problem of images called "vertical smear" which appears in the vertical direction if a voltage drop is caused by the power supply lines 3 or the load lines 2.

Figure 4A:
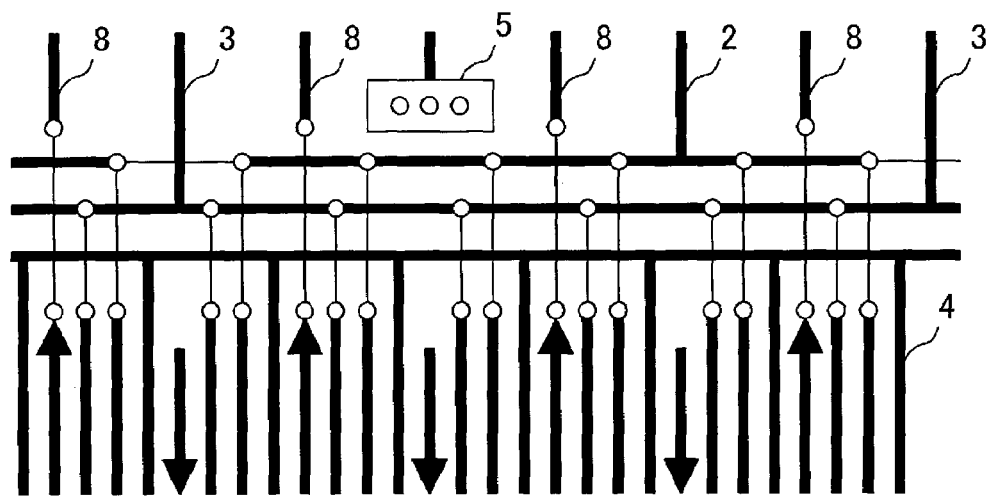
FIGS. 4A and 4B are layout diagrams of wiring intersections in the first embodiment, respectively.
Figure 4B:
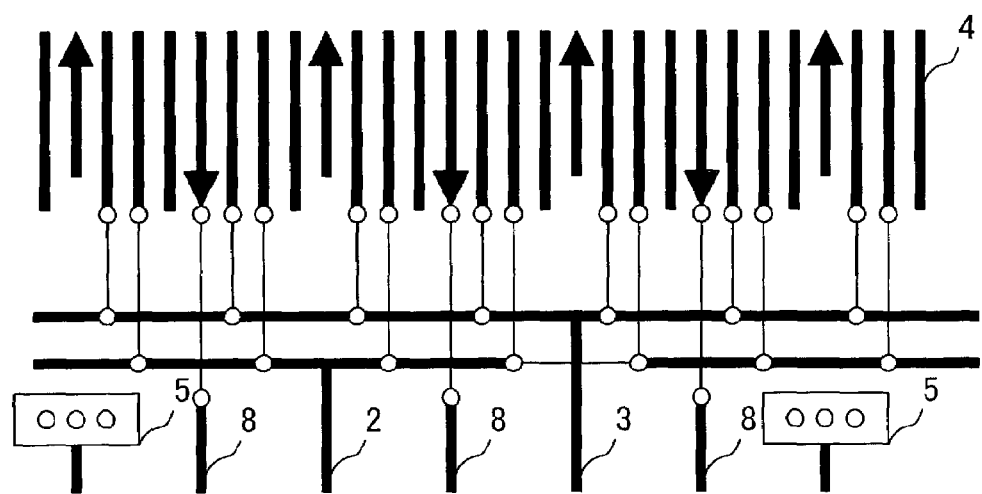

FIGS. 4A and 4B illustrate a line intersection layout above and below the pixel section by using a similar method of describing wiring. Here, FIG. 4A illustrates an area above the pixel section, while FIG. 4B illustrates an area below the pixel section. The signal lines 8 are marked with an arrow directed toward the signal line terminals 12 (not shown in FIGS. 4A and 4B), and as is apparent from FIGS. 4A and 4B, the lines using a gate-level layer are longest in length. This is because almost no current will flow in the signal lines 8 and therefore tolerances to wiring resistance are larger. The reason why the line length of the load lines 2 and the power supply lines 3 using a gate-level layer is designed to be shorter in this order is the same as in the above case.

The first embodiment is not only capable of keeping the voltage drop to the minimum since the load lines 2 and the power supply lines 3 are brought out to many terminals provided between the signal line terminals 12 as described above, but also ensures stabilization of the supply voltage by connecting the load lines 2 and the power supply lines 3 between the pixels.

Now, in the first embodiment described above, it is possible to make modifications without departing from the scope of the present invention. For example, the glass substrate 20 is used as the TFT substrate in the first embodiment, this substrate can be replaced with an other transparent insulating substrate such as a quartz substrate or a transparent plastic substrate, and further, an opaque substrate may be used when light emitted from the OLED element 24 is designed to be guided toward the top surface.

As regards each of the TFTs in the first embodiment, it is also possible to interchange the n and p conductivity types of the input TFT 25 or the reset TFT 30 by changing the drive waveform properly. Further, as regards the inverter circuit disposed within the pixel, it is not limited to the CMOS inverter as employed in the embodiment, but it goes without saying that it is possible to make modifications such as replacing the n-channel TFT with a constant-current-source circuit, and addition of a buffer transistor in the output stage.

In addition, it is also easy to make changes in the number of pixels, and the panel size, etc. in the first embodiment. Further, the voltage at the common terminal of the OLED element 24 is set at groun potential in this embodiment, and it is needless to say that the voltage value can be varied under specified conditions.

Also in the first embodiment, the gate drive circuits 6 are composed of low-temperature polycrystalline Si TFTs. However, these peripheral drive circuits or part thereof may be formed of a single-crystal LSI (Large-Scale Integrated circuit) for implementations within the scope of the present invention.

The first embodiment has been explained as the OLED element 24 used as a light emitting device. Notwithstanding the foregoing, however, it is obvious that the present invention can be realized by using other general light emitting elements including inorganic elements instead of the OLED element.

In a case where an image in color is formed by providing three separate kinds of light emitting devices, one for each of red, green and blue, it is preferable to achieve color balance by vary a light emitting area and driving voltage conditions of each of the three kinds of light emitting devices. Here, when the drive voltage conditions are to be varied, the drive voltage conditions can be adjusted by varying the voltage of the load lines 2 and the power supply lines 3 for the three colors, respectively, in this embodiment. In this case, from the viewpoint of simplifying the wiring routing, it is preferred to arrange three colors in the form of stripes. However, it is obvious that mutual connections of the load lines 2 and mutual connections of the power supply lines 3 between horizontally adjacent pixels are required for each color, and the input terminals should be divided for each color. As for the arrangement in the first embodiment where the common terminal voltage of the OLED elements 24 is set at ground potential, it is also possible to provide three separate common terminals of the OLED elements 24 for red, green and blue colors, respectively, and to drive the three kinds of light emitting devices at separate appropriate voltages, respectively. Furthermore, it is also possible to achieve a color temperature correction by adjusting the drive voltages properly, based upon display conditions and patterns to be displayed, etc.

Various changes described above can also be applied basically in similar ways to other preferred embodiments to be described subsequently in addition to the first embodiment.

Second Embodiment

A second embodiment according to the present invention will be described by referring to FIGS. 5 and 6.

Figure 5:
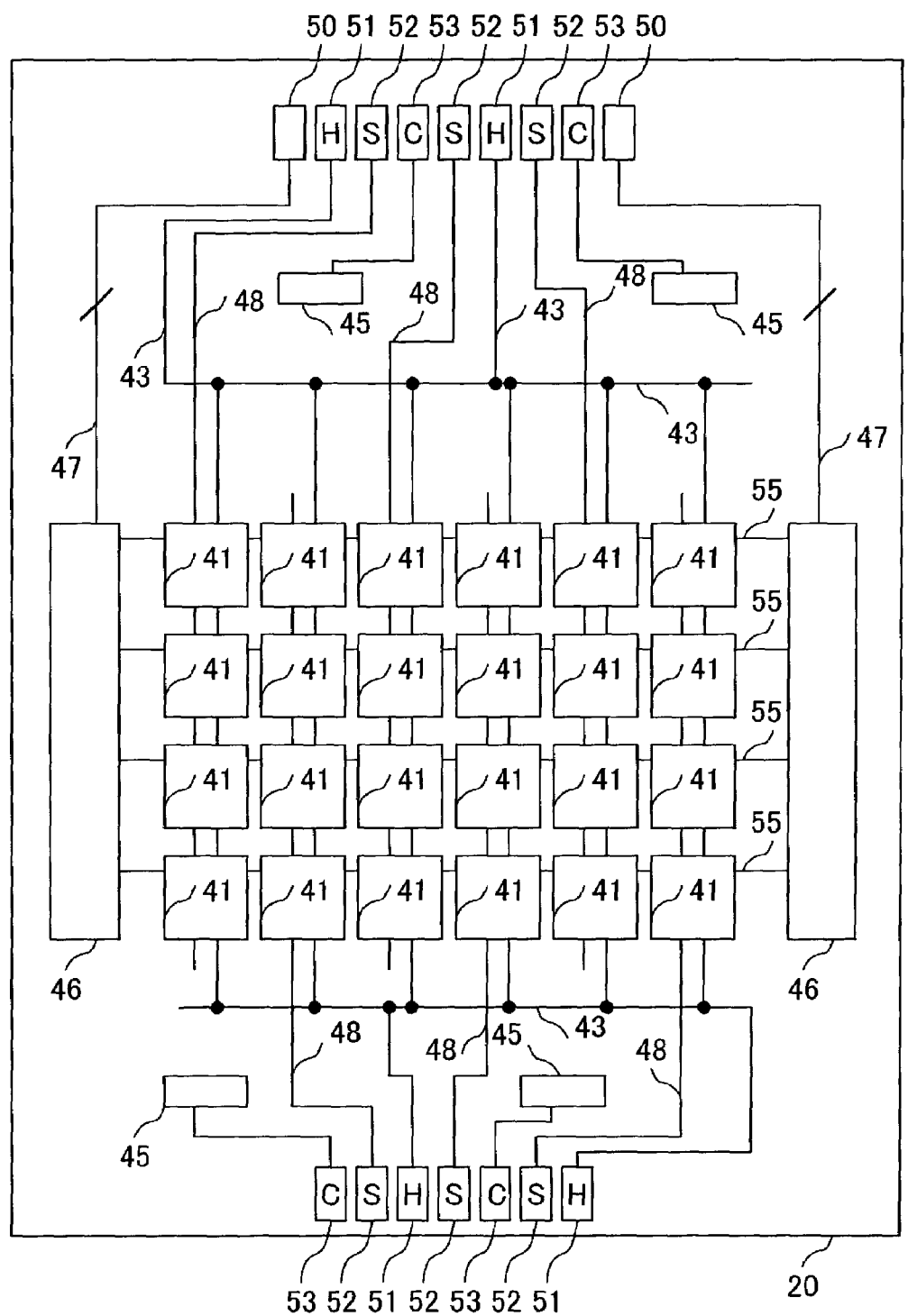
FIG. 5 is a configuration diagram of an OLED display panel of a second embodiment in accordance with the present invention.
Figure 6:
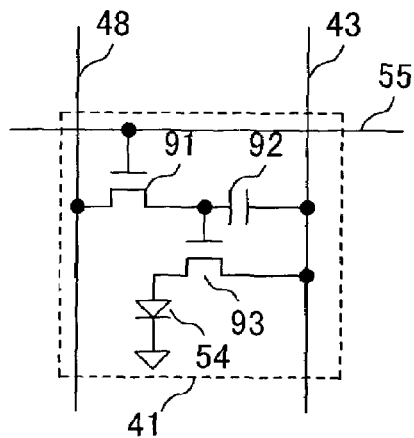
FIG. 6 is an enlarged view of a pixel provided in the second embodiment.

FIG. 5 is a configuration diagram of an OLED (Organic Light Emitting Diode) display panel in accordance with the second embodiment, and FIG. 6 is an enlarged view of a pixel 41. The pixels 41, each of which has an OLED element 54 serving as a pixel-light-emitting element, are arranged in a display section in a matrix configuration. As shown in FIG. 6, the pixel 41 is connected to peripheries via a signal gate line 55, a signal line 48, a power supply line 43, etc. In each of the pixels 41, the signal line 48 is connected to one terminal of a storage capacitor 92 and a gate of a drive TFT 93 via an input TFT 91. The other terminal of the storage capacitor 92 and a source terminal of the drive TFT 93 are connected to the power supply line 43. In addition, a drain terminal of the drive TFT 93 is connected to a common grounding terminal (not shown in FIG. 6) via the OLED element 54. In the peripheral area of a pixel section, as shown in FIG. 5, the signal gate lines 55 are connected to gate drive circuits 46, the signal lines 48 are connected to signal line terminals 52 arranged at the periphery of the glass substrate 20 separately from each other, the power supply lines 43 are joined together above and below the pixel section and are connected to power supply terminals 51. The pixels 41 and the gate drive circuits 46 are fabricated on the glass substrate 20 by using polycrystalline Si TFTs.

Here, FIG. 5 also illustrates 6×4 pixels only to simplify the figure, as in the case of the first embodiment, but actually, pixels of 800 (in a vertical direction)×600 (in a horizontal direction)×three colors (red, green and blue) are arranged in the second embodiment, and a large number of signal line terminals 52 are arranged. More specifically, the signal line terminals 52 are provided in number of 1200 above and below the pixel section, respectively, and the power supply line terminal 51 and the common grounding terminals 53 are arranged alternately between the signal line terminals 52. The common grounding terminals 53 and a common grounding terminal (not shown in FIG. 5) in each of the pixels are connected to each other at grounding contact points 45. Gate drive line groups 47 are connected to the gate drive circuits 46, and are terminated as gate drive line terminal groups 50, but are illustrated in simplified representation in FIG. 5.

The polycrystalline Si TFT structure, the OLED structure, the gate drive circuit 6, etc. in the above-explained configuration are approximately similar to those described in the first embodiment.

Next, operation of the pixel 41 in accordance with the second embodiment will be described by referring to FIG. 6.

When display data fed from an external source are written into the signal line 48 via the signal line terminal 52, the gate line drive circuit 46 successively selects the signal gate lines 55 successively in synchronization with the above-stated writing sequence, by drive signals fed from the gate drive line terminal group 50, Thereby, the signal voltage fed to the signal line 48 is input to the storage capacitance 92 of a gate of the drive TFT 93 in the pixel in the selected row via the input TFT 91 and is retained in the storage capacitance 92. In the pixel 41, the drive TFT 93 is driven according to the written signal voltage, and consequently, the OLED element 214 emits light producing a specified luminance. Such an operation principle of the pixel 41 is similar to that of the second prior art explained earlier.

The second embodiment does not function to cancel variations in polycrystalline Si TFTs of the pixels as described in the case of the first embodiment. However, if such variations in the TFTs can be suppressed sufficiently by adequately controlling their manufacturing process, a high yield rate can be expected because of the simpler configuration of the second embodiment. Furthermore, in the second embodiment, it is possible to increase the number of both the power supply lines 51 and the common grounding terminals 53 to half the number of signal line terminals 52, respectively, and good uniformity in luminance can be achieved for a larger display panel.

Third Embodiment

Figure 7:
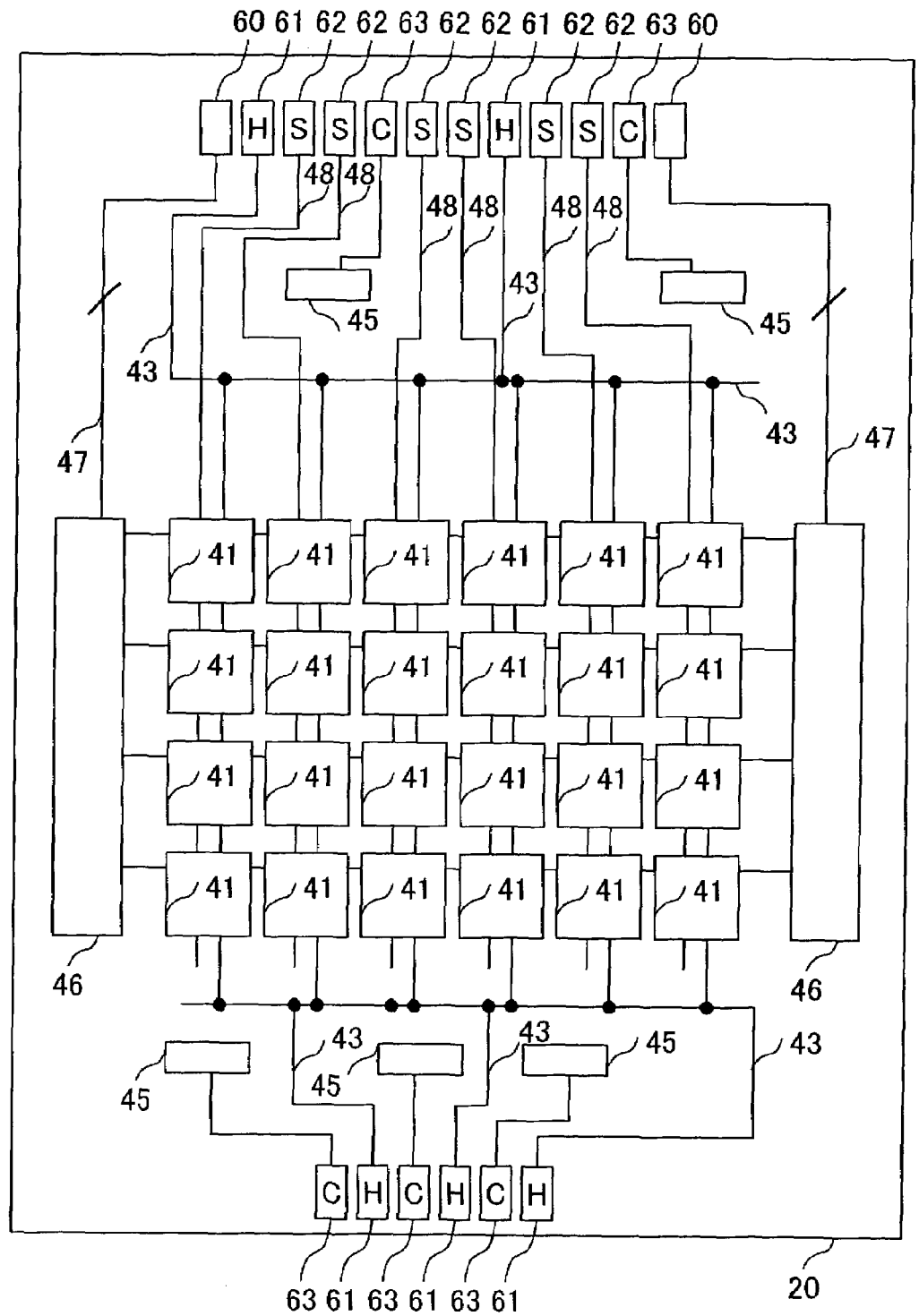
FIG. 7 is a configuration diagram of an OLED display panel of a third embodiment in accordance with the present invention.

The following will describe a third embodiment according to the present invention by referring to FIG. 7.

FIG. 7 is a configuration diagram of an OLED display panel in accordance with the third embodiment.

The configuration and operation of the third embodiment are basically the same as those in the second embodiment. Therefore, explanation of the configuration and operation thereof will be omitted here, and the following will explain the features of the third embodiment, that is, layouts centering upon the signal lines 48 in relation to signal line terminals 62, power supply lines 61 and common grounding terminals 63.

One of the features of the third embodiment as compared with those in the second embodiment is that all the signal lines 48 extend upward from a pixel section, and the signal line terminals 62 are concentrated at an edge portion above the pixel section. Accordingly, an edge portion below the pixel section is provided with the power supply line terminals 61 and the common grounding terminals 63 only.

For prevention of a voltage drop caused by a large current driving, it is preferable that the power supply lines 61 and the common grounding terminals 63 are provided at both the top and bottom portions of the panel. However, as in the case of the third embodiment, the placement of the signal line terminals 62 on one side of the panel provides an advantage of facilitating of mounting of the peripheral circuits on the signal line terminals 62.

Fourth Embodiment

Figure 8:
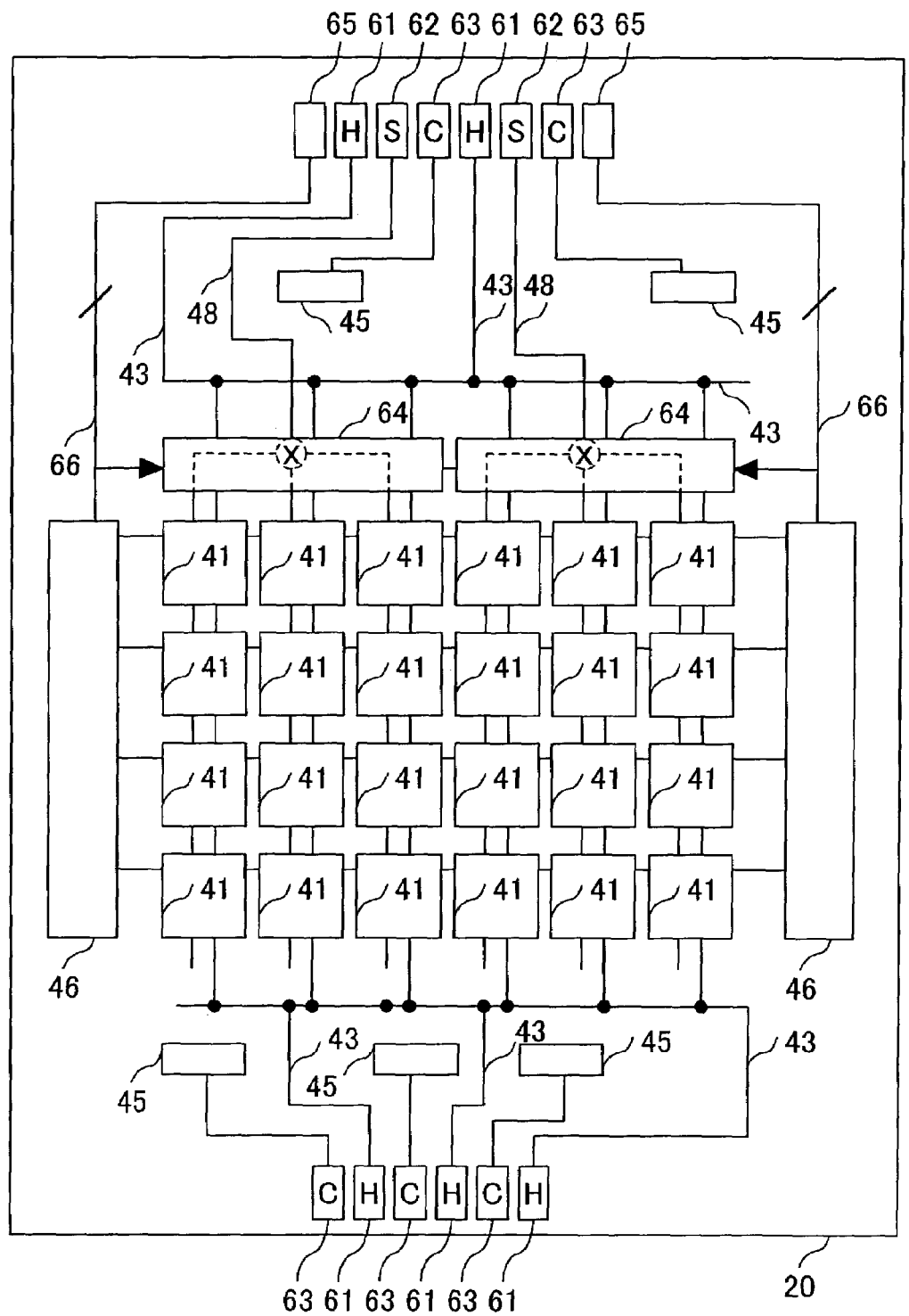
FIG. 8 is a configuration diagram of an OLED display panel of a fourth embodiment in accordance with the present invention.

The following will explain a fourth embodiment according to the present invention by referring to FIG. 8.

FIG. 8 is a configuration diagram of an OLED display panel in accordance with the fourth embodiment.

The configuration and operation of the third embodiment are basically the same as those in the third embodiment. Therefore, explanation of the configuration and operation thereof will be omitted here, and the following will explain the features of the fourth embodiment, that is, layouts of signal line terminals 62 centering upon a signal line selector 64.

One of the features of the fourth embodiment as compared with those in the third embodiment is that signal line selectors 64 are provided between signal lines 48 and signal line terminals 62. The signal line selectors 64 are connected to the gate drive circuits 46, and also are connected to gate-selector drive line groups 66 which are terminated as gate-selector drive terminal groups 65, although they are indicated in simplified representation in FIG. 8. The role of the signal selectors 64 is to supply signals to three signal lines 48, respectively, by using a single signal line terminal 62 and operating a selector switch during one horizontal scanning period. Here, the signal line selector 64 is a combination of three polycrystalline Si-TFT CMOS analog switches.

In the fourth embodiment, it is possible to reduce the number of the signal line terminals 48 to one third by employing the above-explained configuration, and thereby to further reduce labor in mounting the circuits.

In the fourth embodiment, the number of branches of the signal line selector 64 is arranged to be three, and as the number of branches is increased, the number of the signal line terminals can be reduced as much, but the speed of writing into the signal lines 48 will increase accordingly.

Fifth Embodiment

Figure 9:
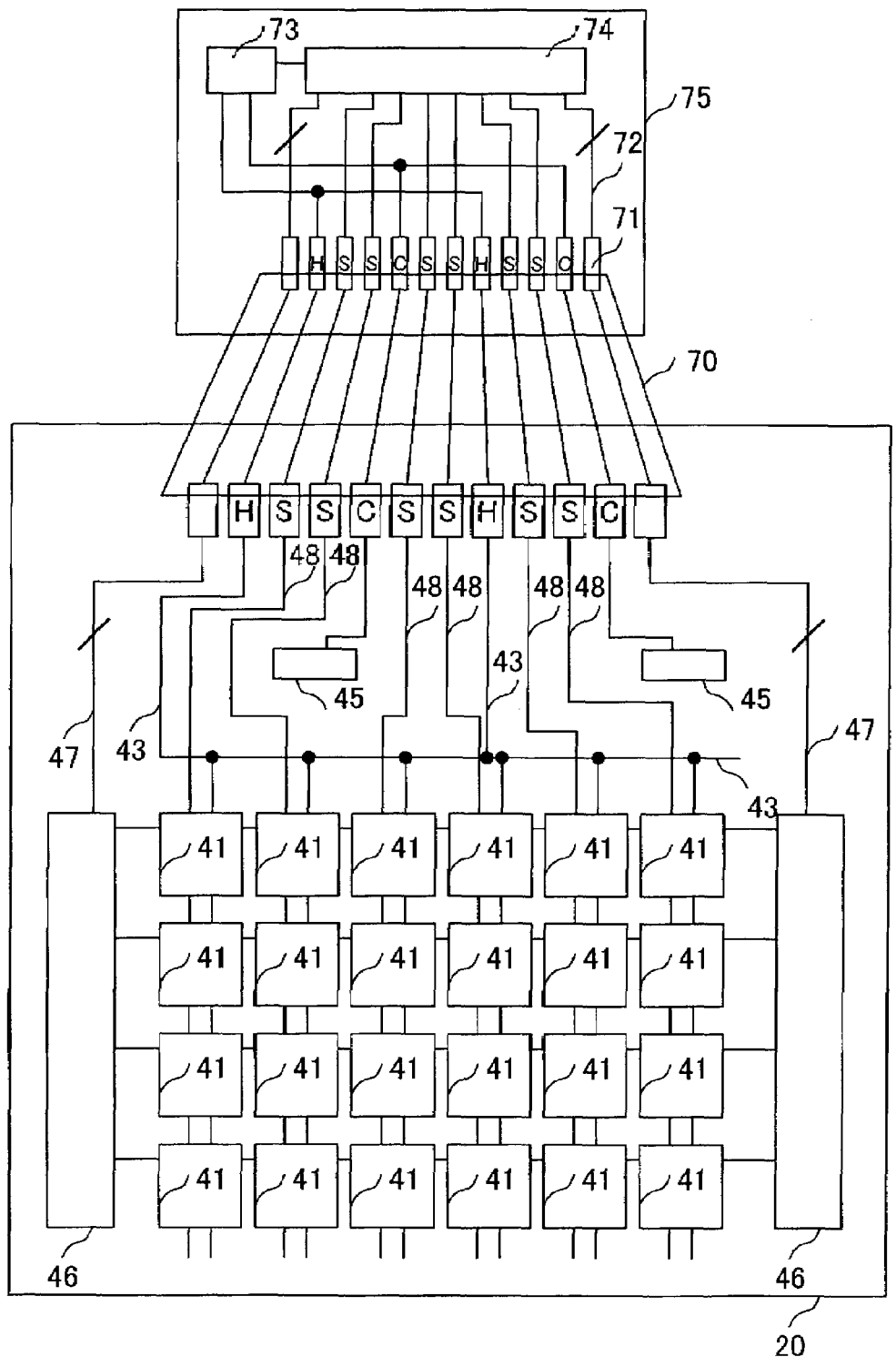
FIG. 9 a configuration diagram of an OLED display panel of a fifth embodiment in accordance with the present invention.
Figure 11:
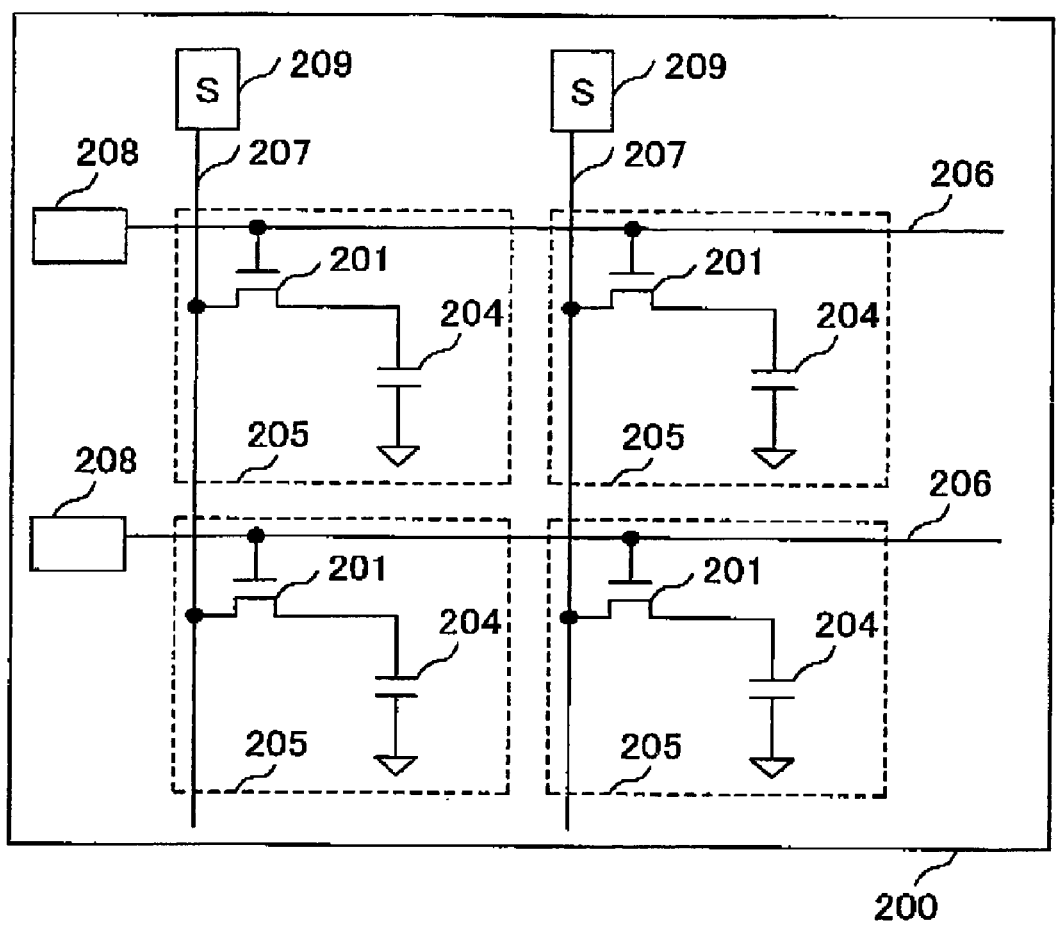
FIG. 11 is a configuration diagram of a liquid crystal display device of a first prior art.
Figure 12:
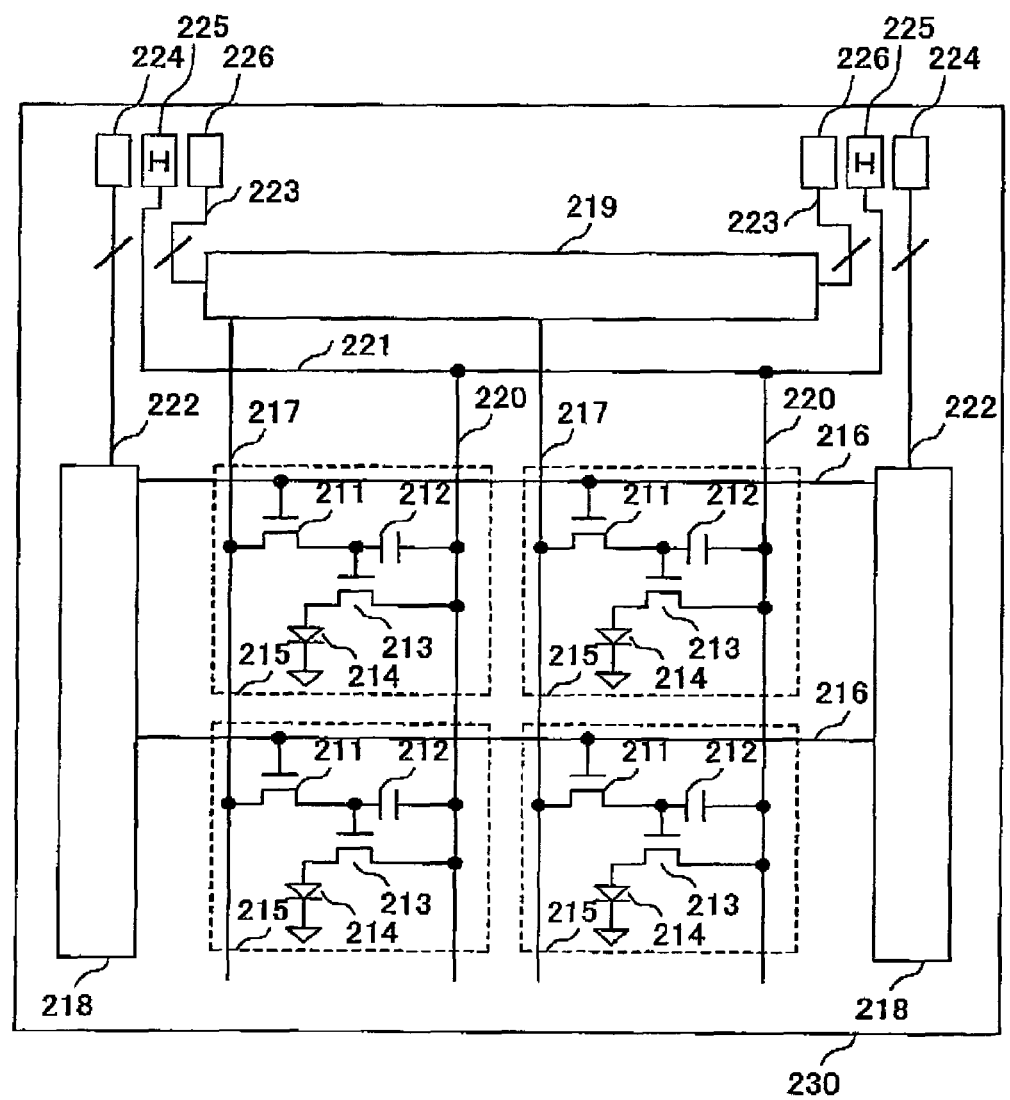
FIG. 12 is a configuration diagram of a light emitting display device of a second prior art.

The following will explain a fifth embodiment according to the present invention by referring to FIG. 9.

FIG. 9 is a configuration diagram of an OLED display panel in accordance with the fifth embodiment.

The configuration and operation of the fifth embodiment are basically the same as those in the third embodiment. Therefore, explanation of the configuration and operation thereof will be omitted here, and the following explanation will focus on the features of the fifth embodiment, that is, a mounting configuration external to signal line terminals 62, power supply line terminals 61, and common grounding terminals 63.

One of the features of the fifth embodiment as compared with those in the third embodiment is that all the terminals including the power supply line terminals 61 and the common grounding terminals 63 are concentrated above the pixel section, and that a drive circuit board 75 is provided externally to the terminals via a flexible cable 70.

The drive circuit board 75 is provided with flexible cable mounting terminals 71, and further is provided with a panel driver IC 74 and a power supply circuit 73. These are mutually connected to one another via wiring 72 on the substrate, and the signal voltages output from the panel driver IC 74 and a supply voltage output from the power supply circuit 73 are rearrange on the drive circuit substrate 75 so as to be in the order corresponding to the signal line terminals 62, the power supply line terminals 61 and the common grounding terminals 63.

In the fifth embodiment, it is possible to realize a display panel more economically by using the panel driver IC 74. One panel driver IC 74 is depicted in FIG. 9, but actually, six panel driver ICs 74 each having 400 terminals are mounted.

Sixth Embodiment

Figure 10:
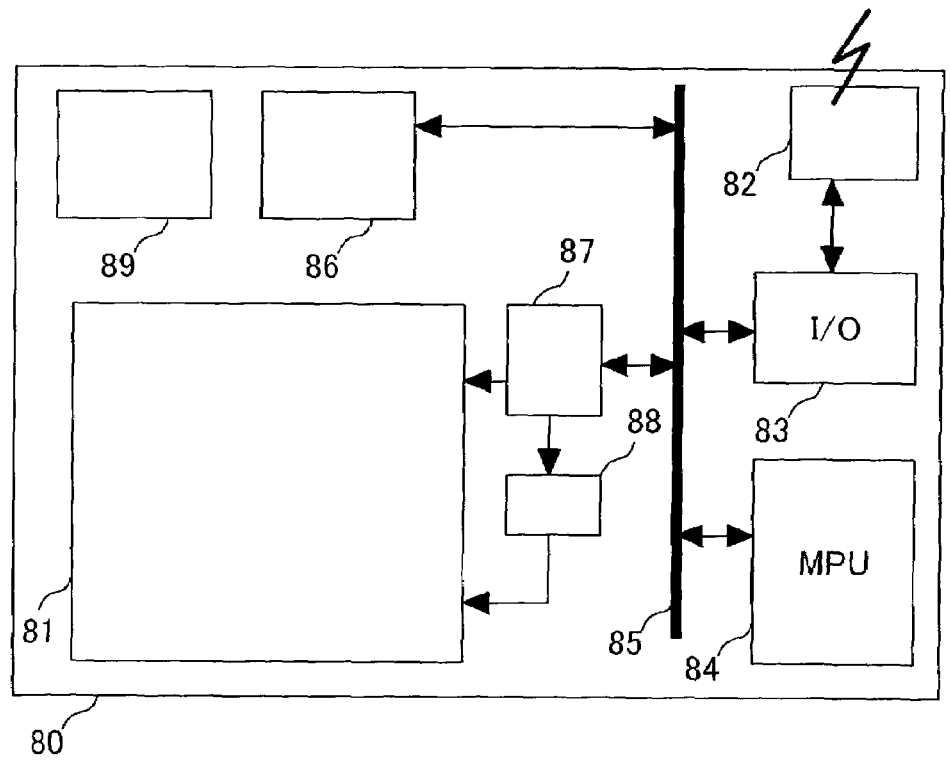
FIG. 10 is a configuration diagram of an image display terminal of a sixth embodiment in accordance with the present invention.

The following will explain a sixth embodiment according to the present invention by referring to FIG. 10.

FIG. 10 is a configuration diagram of a personal digital assistant (PDA) 80 in accordance with the sixth embodiment.

Compressed video data or the like are externally supplied to a wireless interface (I/F) circuit 82 as wireless data complying with the Bluetooth specification, and the output of the wireless interface (I/F) circuit 82 is connected to a data bus 85 via an input/output (I/O) circuit 83. Further, a microprocessor unit 84, a display panel controller 87, a frame memory 86 and others are connected to the data bus 85. In addition, an output of the display panel controller 87 is input to an OLED display panel 81 and a power supply circuit 88, and further, the output from the power supply circuit 88 is also input to the OLED display panel 81. The PDA 30 is provided with another power supply 89. The OLED display panel 81 has the same configuration and perform the same operation as those of the aforementioned first embodiment, and the explanation of the internal configuration as well as the operation is omitted here.

In the following, operation of the sixth embodiment will be described. First, the wireless I/F circuit 82 receives compressed video data from the outside based upon a command, and transfers the video data to both the microprocessor unit 84 and the frame memory 86 via the I/O circuit 83. Upon receiving a command from a user, the microprocessor unit 84 drives the PDA 80 as required, and executes decoding, signal processing and information display of the compressed video data. The video data having been subjected to signal processing are temporarily stored in the frame memory 86.

Here, when the microprocessor unit 84 issues a display command, the video data are fed from the frame memory 86 to the OLED display panel 81 via the display panel controller 87 and the voltage supply circuit 88, and thereby the OLED display panel 81 displays the input video data in real time. At this time, the display panel controller 87 also outputs a specified timing pulse and a triangular waveform voltage required for displaying the video image. The sequence in which the OLED display panel 81 uses these signals to display in real time display data derived from six-bit video data on the pixel section is the same as that described in the first embodiment. Incidentally, the power supply 89 contains a secondary battery to supply power for driving the entire PDA 80.

According to the present embodiment, it is possible to provide the PDA 80 which exhibits superior uniformity in display luminance and has a large display area.

In the sixth embodiment, the OLED display panel described in the first embodiment is employed. However, it is obvious that any other types of display panels described in the other embodiments according to the present invention may be used.

According to the present invention, it is possible to provide an image display apparatus which exhibits superior uniformity in display luminance over a relatively large screen area.

What is claimed is:

1. An image display apparatus comprising:
a display section composed of a plurality of pixels;
a plurality of signal lines for supplying display signals into said plurality of pixels;
a portion of pixel selecting means for selecting ones from among said plurality of pixels to be supplied with said display signals; and
a plurality of power supply lines for supplying display electric powers to said selected ones of said plurality of pixels,
wherein said display section, said plurality of signal lines, said portion of pixel selecting means, and said plurality of power supply lines are disposed on a same substrate,
a plurality of signal input terminals for inputting said display signals to said plurality of signal lines, and a plurality of power supply input terminals for supplying said display electric powers to said plurality of power supply lines are disposed on said same substrate, and said plurality of power supply input terminals are arranged such that at least one of said plurality of power supply input terminals is disposed between adjacent ones of said plurality of signal input terminals.

2. An image display apparatus according to claim 1, wherein said plurality of signal input terminals and said plurality of power supply input terminals are arranged substantially in a line.

3. An image display apparatus according to claim 1, wherein each of said plurality of pixels is provided with one of a plurality of organic light emitting elements driven by a corresponding one of said display electric powers supplied by said plurality of power supply lines.

4. An image display apparatus according to claim 1, wherein said portion of pixel selecting means comprises polycrystalline Si thin film transistors.

5. An image display apparatus according to claim 1, wherein said plurality of signal input terminals and said plurality of power supply input terminals are arranged periodically.

6. An image display apparatus according to claim 5, wherein said plurality of signal input terminals and said plurality of power supply input terminals are arranged alternately.

7. An image display apparatus according to claim 3, wherein said plurality of organic light emitting elements are divided into a plurality of groups, ones of said plurality of organic light emitting elements belonging to a same one of said plurality of groups have first electrodes thereof connected to a same one of a plurality of common electrode terminals, and said plurality of signal input terminals, said plurality of power supply input terminals, and said plurality of common electrode terminals are arranged periodically.

8. An image display apparatus according to claim 7, wherein said plurality of common electrode terminals are approximately equal in number to said plurality of power supply input terminals.

9. An image display apparatus according to claim 5, wherein said plurality of signal input terminals and said plurality of power supply input terminals are disposed above and below said display section.

10. An image display apparatus according to claim 5, wherein said plurality of signal input terminals and said plurality of power supply input terminals are disposed only above said display section.

11. An image display apparatus according to claim 5, wherein said plurality of signal input terminals and said plurality of power supply input terminals are disposed above said display section, and said plurality of power supply input terminals, but not said plurality of signal input terminals, are disposed below said display section.

12. An image display apparatus according to claim 1, wherein a switching means is provided between said plurality of signal input terminals and said plurality of signal lines for selectively connecting one of said plurality of signal input terminals to a corresponding one of said plurality of signal lines.

13. An image display apparatus according to claim 1, wherein said plurality of power supply lines are connected together in one of inside said display section and in vicinities of said display section.

14. An image display apparatus according to claim 13, wherein ones of said plurality of power supply lines associated with ones of said plurality of pixels generating a same color are connected together.

15. An image display apparatus according to claim 1, wherein said plurality of signal input terminals are connected to a driver IC external to said same substrate.

16. An image display apparatus comprising:

a display section composed of a plurality of pixels;

a plurality of signal lines for supplying display signals into said plurality of pixels;

a portion of pixel selecting means for selecting ones from among said plurality of pixels to be supplied with said display signals;

a plurality of power supply lines for supplying display electric powers to said selected ones of said plurality of pixels;

means for storing display data; and means for generating said display signals from said display data on command, wherein said display section, said plurality of signal lines, said portion of pixel selecting means, and said plurality of power supply lines are disposed on a same substrate, a plurality of signal input terminals for inputting said display signals to said plurality of signal lines, and a plurality of power supply input terminals for supplying said display electric powers to said plurality of power supply lines are disposed on said same substrate, and said plurality of power supply input terminals are arranged such that at least one of said plurality of power supply input terminals is disposed between adjacent ones of said plurality of signal input terminals.

* * * * *